Dec. 28, 1965

J. C. HAENICHEN 3,226,611

SEMICONDUCTOR DEVICE

Filed Aug. 23, 1962

INVENTOR.
John C. Haenichen

BY

Mueller, Aichele & Rauner

ATT'YS.

United States Patent Office 3,226,611
Patented Dec. 28, 1965

3,226,611
SEMICONDUCTOR DEVICE
John C. Haenichen, Scottsdale, Ariz., assignor to Motorola, Inc., Chicago, Ill., a corporation of Illinois
Filed Aug. 23, 1962, Ser. No. 218,904
15 Claims. (Cl. 317—234)

This invention relates to stabilized or passivated silicon semiconductor devices and more particularly to a method of fabricating stabilized planar NP silicon diodes and PNP transistors suitable for high voltage operation.

The necessity for making semiconductor devices stable and reliable is readily apparent when one considers the importance of their use in civil and military electronics wherein some applications hundreds or thousands of such devices are employed together in a dependent manner. Semiconductor devices that have been stabilized in certain ways are sometimes referred to as passivated devices.

Among the most stable and reliable semiconductors are those of silicon of a type known as planar passivated devices. To date, however, planar passivated NP diodes and PNP transistors have had a serious limitation in that they have not been suitable for use at high voltages. There is a ready commercial market for high voltage planar passivated devices and considerable research and development effort has gone into the solution of this problem.

The difficulty in preparing high voltage NP diodes and PNP transistors of the planar passivated type involve a number of related processing and structural factors which cause such planar passivated devices of an intended high voltage design to act like an entirely different and unsuitable device.

Planar passivated NP diodes and PNP transistors are stable and reliable largely because a protective film of silicon dioxide or glass covers portions of the junctions that might normally change or degrade if exposed. It happens that when the proper silicon requirements for high voltage operation are met in the P regions of these devices, the protective glass or silicon dioxide film causes this material to act as if it were N-type nearest the film. This false N region connects to the true N region and provides a path through which current can flow in a unique way which will be discussed later. The false N region is called an N-type induced channel and causes such a serious change in some of the device characteristics that only the low voltage type of planar passivated devices have been feasible in the past.

A really superior NP diode or PNP transistor would be one having the desirable characteristics of the planar passivated structures but operable at high voltages as well.

Accordingly, it is an object of this invention to provide a means by which high voltage planar passivated devices may be made.

It is another object of this invention to provide a means of constructing induced N regions or channels of a desired shape.

A feature of this invention is the use of well-known selective diffusion techniques to lower the resistivity of pi silicon in order to interrupt induced N regions occurring at silicon dioxoide—pi silicon and glass—pi silicon interfaces.

Figure 1:
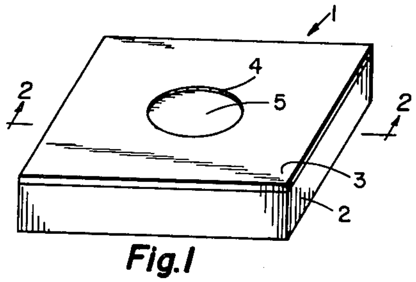
FIG. 1 shows a silicon dioxide coated silicon die after a region of the silicon dioxide has been selectively etched away.

For convenience in reading, and by way of example, the conductivity types for an NP diode and for a PNP transistor are shown in the figures of the drawings which are cross-sections.

In accordance with this invention excellent planar passivated NP junction devices and planar passivated PNP transistors may be made that are suitable for high voltage use.

Devices of the planar passivated type suitable for high voltage use might be expected to consist of at least one diffused N region within a region of pi silicon, i.e., high resistivity P-type silicon, to form an NP junction having a boundary at the surface of the silicon and covered with a passivating film. Unfortunately, the passivating film induces an N-type channel at the interface between the film and the pi silicon, and the channel seriously degrades certain parameters of the device. It has been found that such a channel may be interrupted by selectively diffusing P impurity into the pi silicon lying just outside the periphery of the surface portion of the NP junction, and the degrading effect of the channel can be avoided in this manner.

The following text and accompanying drawings are to explain more fully the nature of high voltage planar devices and their method of fabrication according to this invention.

As is well-known, by masking off portions of silicon with diffusion resistant materials, diffusion may be confined to regions at selected areas of the silicon; this is selective diffusion. Some impurity materials diffuse very slowly through silicon dioxide and certain glasses so that it is possible to partially cover or mask regions of a silicon wafer with a film of one or more of these in order to prevent some regions being diffused to any great extent by impurity materials of this kind, while allowing diffusion to take place at other regions. When rectifying junctions are formed by selective diffusion, as they are in planar passivated devices, the surface portion of the junction lies beneath a film of silicon dioxide or glass. This is the case because the impurity being diffused at an opening in the film diffuses in all directions into material having a lower concentration of this impurity so that the silicon also becomes diffused a slight distance under the film edges bounding the exposed regions; therefore, the junction at the surface of the silicon lies beneath a silicon dioxide or glass film. If the film at the silicon was thermally formed, that is, formed by heating and oxidizing the silicon wafer, the silicon-film interface will be very clean as contaminants will tend to remain at the surface since the film forms beneath them. By virtue of this fact, junctions at this interface will be very clean and, therefore, be more free of surface contaminants which may ionize. Ordinarily, due to the intense electric field across a back biased rectifying junction, surface conduction by ions will contribute greatly to junction leakage current.

Planar passivated junctions which are junctions prepared and protected as just described tend to be stable and reliable, not only because of their intrinsic separation from ionizable surface contaminants, but also because the dielectric and insulating qualities of silicon dioxide or the glasses ordinarily covering the junction at the surface cause a reduction in the electric field and in conduction at this region. The silicon dioxide or glass covering the junction is referred to as a passivating film.

As previously mentioned, a major problem common to NP planar passivated junction devices which, of course, includes NP planar passivated diodes and PNP planar passivated transistors, has been that of making these devices suitable for high voltage operation, i.e., making devices with a high breakdown voltage characteristic. To have high breakdown voltages, it is necessary that the P material of the NP junction have a fairly high resistivity. High resistivity P-type silicon is called pi silicon. The planar passivated diode has a passivating film of silicon dioxide or glass covering the surface portion of the NP junction which normally causes a smaller reverse current, however, when the P material is of high resistivity, the reverse current becomes much greater and the diode has a current versus voltage curve similar to that of a current limiting device.

A current limiter structure based on a well-known physical model, requires that a flat thin region of relatively high resistivity silicon, called a channel, lie adjacent a region of silicon of the opposite conductivity type; one terminal of the device shorts or resistively connects both types of material at one region and the other terminal is connected at a different region to high resistivity material of just one type. The device is so constructed that current carriers flow preferentially through the thin high resistivity material, and when a voltage above a certain critical voltage, called the "pinch off voltage," is applied across the terminals of the device, a depletion region lying both within and outside of the channel closes off the channel and further acts so that a nearly fixed voltage drop exists across the length of it. A particular voltage drop across the channel of a device causes that part of the depletion region within it to assume a given form and this largely determines what the electrical resistance of the channel will be. Therefore, at voltages above the "pinch off voltage," the nearly constant voltage across the channel fixes its resistance and under these conditions the current that can flow through it is limited to some nearly constant value. The device structure is such that the voltage difference between the applied and the pinch off voltage simply causes further thickening of the depletion region in a space outside of the channel and acts as if it were across a simple reverse biased junction so that the small increase in the current occurring due to this particular voltage difference is of the order of junction leakage current. The device will limit current up to a given maximum applied voltage where voltage breakdown occurs.

In the planar passivated NP junction the silicon dioxide or glass in some manner causes the lightly doped or high resistivity P-type semiconductor material beneath its surface to act as if it were a high resistivity N-type channel, and since this channel usually leads to some high leakage, high recombination or other high conductivity region between the N channel and the pi silicon which is roughly equivalent to the shorted resistively connected terminal region of the current limiter, this whole structure is then somewhat like that of the previously discussed semiconductor current limiting device. Hence, for this structure, a current versus reverse voltage curve will resemble that of a current limiter rather than that of an ordinary back biased junction. The formation of an apparent N region of this kind is called induced channeling. Also, since the channel that is induced extends the N region of the NP junction to all of the adjacent area of pi silicon that is coated with a continuous silicon dioxide or glass film, there may be quite a large capacitive effect associated with the phenomenon. It is interesting to note that when the film is removed, the current versus voltage curve becomes that of an ordinary unpassivated reverse biased junction. In the past, in order to have the inherent reliability and very low reverse currents, it has been both necessary and desirable that the silicon dioxide or glass cover the NP surface region so that planar passivated NP junctions have necessarily been of the low breakdown voltage type since wafers of P-type silicon of a low resistivity had to be used to prevent the induced channeling or current limiter effect from occurring.

The mechanism by which N induced channels are formed is not known in this case. It is believed that certain positive ions such as hydrogen ions diffuse into and are held by the glass or silicon dioxide film and so give it a positive charge which induces a negative charge at the surface of the pi silicon. If enough electrons are brought to the surface so that their numbers are greater than the number of available holes, this region will act as if it were N-type material since any conduction which occurs will be due in the largest part to the flow of these electrons.

An NP junction having the characteristics of the usual planar passivated junction but with a high breakdown voltage as well, can be made using ordinary device design considerations if induced channeling can be prevented or its effects eliminated or minimized. The fabrication process to be illustrated and described for making high voltage planar passivated NP junction devices uses a means of minimizing the effect of the induced channel and accomplishes this by interrupting the channel by a solid state diffusion operation.

FIG. 1 is a rectangular semiconductor element 1 consisting of a die portion 2 cut from a large wafer (not shown) of high resistivity P-type silicon called pi silicon upon which a region of silicon dioxide 3 has been thermally grown. A circular region 4 of the silion dioxide has been removed to expose the underlying silicon and N impurity will be selectively diffused into the silicon at this region 5. The masking action of the silicon dioxide prevent significant amounts of N impurity from diffusing into the covered regions.

Figure 2:
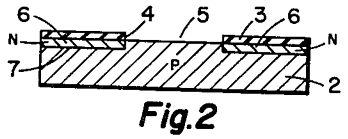
FIG. 2 is a cross section through the die of FIG. 1.

FIG. 2 a sectional view of the die taken at 2—2, shows a layer of silicon dioxide 3 at just the upper surface of the silicon, but it should be understood that in practice all regions of the silicon that are not intended to be significantly altered by diffusion may be covered with a silicon dioxide or glass film. In practice, it is common to fabricate many semiconductor units at once on a single wafer. Thus, any die shown in the drawings represents part of a larger wafer. However, the description will be simplified by referring to individual die units.

An N-type channel region 6 is formed at the silicon dioxide-pi silicon interface and is represented schematically as the region lying between the line 7 of FIG. 2 and the silicon dioxide 3.

Figure 3:
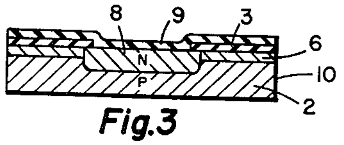
FIG. 3 shows the die following diffusion of the silicon.

In FIG. 3, the wafer of silicon is shown after having been diffused with phosphorus impurity to form an N region 8. The phosphorous was supplied from a layer of phosphosilicate glass 9 which was formed initially on the silicon in a prediffusion step. A prediffusion step of this type to form an impurity source at the surface of the silicon is sometimes referred to as an impurity predeposition and will be discussed further on. The N-type diffused region 8 is electrically in direct contact with the N-type channel region 6 so that the NP junction exists across the surface of the wafer and terminates as a surface NP region 10 at the exposed edges where the die was cut from the wafer.

For illustrative purposes, discrete regions of silicon dioxide and glass are shown in the drawings. It should be understood that due to the interaction of the glass and silicon dioxide at prediffusion and diffusion temperatures, the silicon dioxide becomes a glass. The glasses will also interact and change in composition, and the existence of discrete boundaries as illustrated between glasses formed and treated as these are, is questionable.

Figure 4:
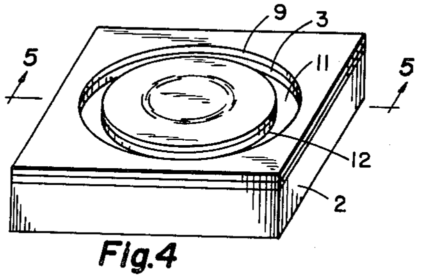
FIG. 4 shows the die following preparation for a subsequent diffusion.
Figure 5:
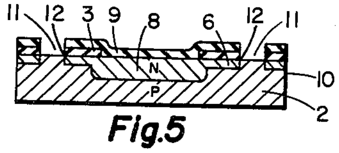
FIG. 5 is a cross section through the die of FIG. 4.
Figure 6:
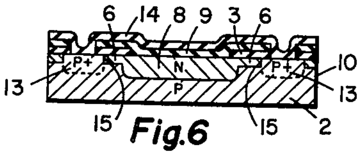
FIG. 6 is a cross section through the die of FIG. 3 following the diffusion treatment.

In order to eliminate the current limiter action of the diode, a ring of the silicon dioxide 3 and phosphosilicate glass 9 is etched from the die surface as shown in FIG. 4. The annular ring 11 was etched through the silicon dioxide and glass to expose a region of pi silicon lying a small distance outside of the NP region of the device. This is shown more clearly in FIG. 5. The opening 11 has interrupted the induced channel 6 but this alone is an inadequate treatment since etching has also exposed a continuation of the device junction formed by the N channel and the pi silicon. The periphery of this continuation is at the inner edge 12 of the etched annulus and the device junction does not have the low leakage currents of a passivated junction since the continued junction region terminates at the edge of the silicon dioxide or glass rather than at a boundary lying fully beneath it. In FIG. 6, the exposed silicon is shown after being selectively diffused with P impurity to form a low resistivity P region 13. The P impurity source for this diffusion was provided by a layer of borosilicate glass 14 which was formed on the wafer in an impurity predeposition step prior to the diffusion. The diffused P region 13 extends back under the silicon dioxide so that the termination 15 of the NP junction so formed is moved back under the silicon dioxide and glass. The junction is now protected by the passivating film so that it has the low leakage associated with planar passivated devices and in addition the channel cannot extend into the more heavily P-type diffused region 13 as the concentration of the induced negative charges is not as great as the concentration of available holes due to the increased concentration of P impurity. This P region will be subsequently referred to as the anti-channel region.

Figure 6A:
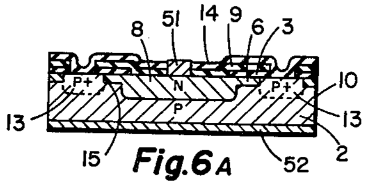
FIG. 6A is a cross section similar to FIG. 6, and showing the condition of the die after contacts have been applied to it.

An NP junction thus formed will have a high breakdown voltage if the diffused low resistivity P anti-channel region 13 is located away from the diffused N region. Although the resistivity of this P-type anti-channel region may be very low, the small remaining part 6 of the induced channel lying between the diffused N region 8 and the anti-channel region 13 has the characteristics of high resistivity N-type material so that if this remnant of the induced region is not too small a reasonably wide depletion region will expand into it to satisfy the high breakdown voltage condition there. Thus a high breakdown voltage characteristic of the junction is attained by constructing the device so that all low resistivity material of either P or N conductivity type proximate to the junction has an adequately thick high resistivity region of the other conductivity type opposite it. FIG. 6A is a cross sectional view of the diode after metal contacts 51 and 52 have been applied respectively to N region 8 and to P region 2.

Figure 7:
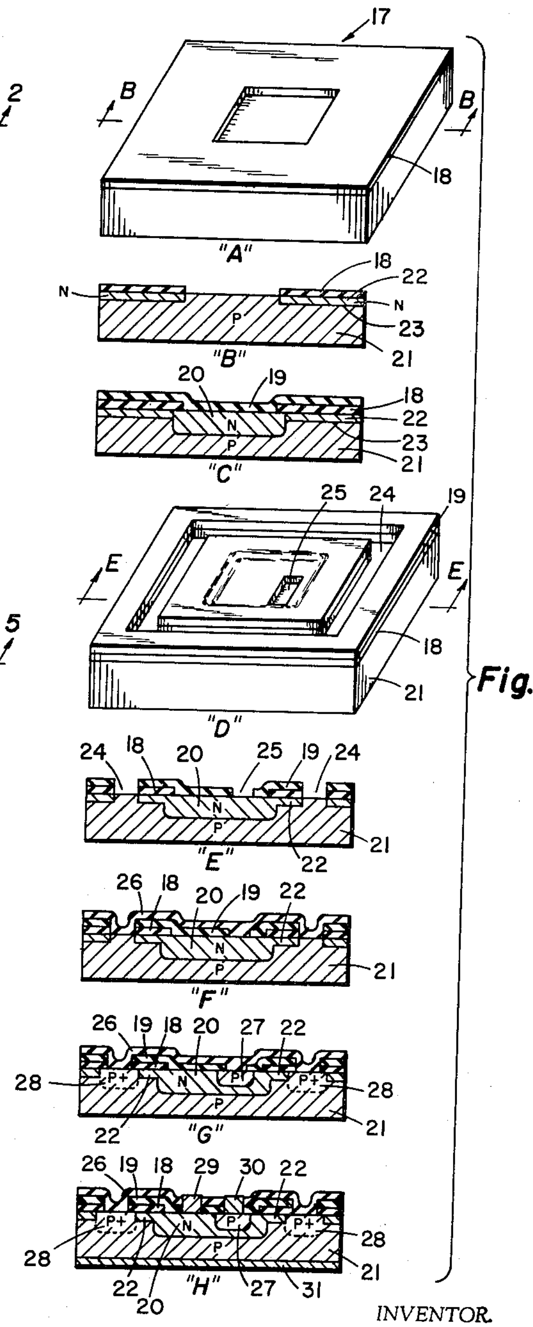
FIG. 7 shows the steps in the preparation of a nonchanneling PNP planar passivated transistor.

Planar passivated PNP transistors having a high collector-to-base breakdown voltage may be prepared in much the same manner as the previously described high voltage planar passivated diode. Suitable steps for fabricating such as device are illustrated in FIG. 7, and the steps are identified as steps A through H. A semi-conductor element 17 consisting of pi silicon partially covered with thermally grown silicon dioxide 18 is selectively diffused with N impurity from a layer of predeposited phosphosilicate glass 19 to form an N region 20 and establish a collector-base junction. The N diffused region 20 is the base region of the device, and the pi region 21 just outside of this region is the transistor collector. The induced N region 22 is represented schematically as lying between the line 23 and the silicon dioxide 18. After the N diffusion the previously diffused regions remain covered with phosphosilicate glass 19. Phosphosilicate glass is such that it may be used as a diffusion mask against boron impurity in the same manner as the silicon dioxide was used in masking against phosphorus.

Portions of layers 18 and 19 are etched away so that two regions of silicon 24 and 25 are exposed as shown at step E of FIG. 7. The semiconductor element is diffused with P impurity from a predeposited film of borosilicate glass 26 to form the emitter region 27 and the anti-channel region 28 of P diffused material is made at the same time with the same exposure to P impurity.

Following this, regions of glass are removed to expose silicon at the base region 20 and the emitter region 27 of the transistor. The base and emitter may then be metallized to provide contacts 29 and 30, so that electrical connections may subsequently be made to the contacts. A collector contact 31 may be metallized on the other side of the die.

The P diffusion to form the anti-channel P region in planar passivated devices is non-critical, having just the requirements that the resistivity of the diffused P region be less than of the order of one ohm-centimeter near the surface and that the P impurity be of a suitable type that may be selectively diffused such as boron. A typical silicon dioxide or glass thickness for masking during diffusion of the P region on the NP diode described is one micron. The glass film thickness for the transistor is governed by the requirements of the length of time and the temperature for forming the emitter junction by diffusion but 4000–5000 angstrom units is suitable for most planar device diffusions.

Silicon dioxide is thermally grown by exposing silicon at a temperature in the order of 1100° C. to water vapor. The water vapor is customarily brought into contact with silicon by bubbling oxygen or hydrogen gas through water to saturate it and then flowing the gas-water vapor over the silicon. Alternatively, water is vaporized by boiling and the steam is allowed to flow over the hot silicon. The silicon is usually heated and oxidized in a furnace of the combustion tube type. The formation of impurity bearing glasses is discussed later in diffusion processing.

The invention as described thus far has been somewhat specific in its application, since it is largely concerned with the solution of a problem peculiar to NP planar passivated junctions. However, a more fundamental use of the techniques used in solving this problem would be that of selectively diffusing anti-channel regions so that N-type induced channel regions of various shapes may be formed and/or isolated and it is intended that the scope of the invention include this use. Most simply, a channel of a given size and shape may be formed by oxidizing pi silicon to form silicon dioxide having a resulting underlying N-type induced channel, and selectively etching the silicon dioxide away so that the desired shape of silicon dioxide and channel is left and then diffusing the P-type anti-channel region into the silicon not covered by the silicon dioxide.

The induction of N-type channels in planar devices when passivating and similar films of highly resistive inorganic material are formed on pi silicon is largely independent of the device design. It is intended that the scope of the invention also include the interruption of such channels in order to improve devices other than planar devices by selectively diffusing P-type impurity into this P-type silicon in order to lower the resistivity below the level at which such channels may exist in selected regions at the surface of the silicon.

General fabrication techniques for planar passivated devices are known in the art. Examples of these techniques are given in the following text.

Well-known photolithographic techniques are very useful in removing selected regions of silicon dioxide and impurity bearing glasses. A photosensitive resist that is not attacked by hydrofluoric acid is applied in liquid form to the silicon in a uniform coating and allow to dry. A pattern consisting of transparent and opaque areas, the opaque areas corresponding in shape to the regions that are to be removed, is placed against the surface of the resist covered silicon and then this system is exposed to ultra-violet light. The resist is developed and the areas of the resist that were shaded from the light by the opaque areas of the pattern are washed away uncovering the underlying silicon dioxide or glass film. The silicon is then placed in hydrofluoric acid and the unprotected areas of this film are etched away. After cleaning and removal of the remaining photo-resist, the silicon may be diffused.

Although the diffusion used to form the anti-channeling region is a diffusion using a P impurity such as boron from a borosilicate glass impurity source, to be described later, the preparation and use of the calcium phosphosilicate glass or another functionally equivalent phosphosilicate glass as an N impurity (phosphorus) source is directly important to this process. Calcium phosphosilicate glass may be used in the preparation of N regions of silicon and then, since it also has an effective masking action against the diffusion of boron, it may be used at the same time, and where conditions warrant, both as a phosphorus source and as a masking material for selectively diffusing boron into silicon.

The calcium phosphosilicate glass is formed on the surface of the silicon in a prediffusion operation by heating it in a closed system in the presence of a source glass previously prepared by heating calcium oxide and phosphorus pentoxide together. After a suitable thickness of calcium phosphosilicate glass has been formed on the silicon, the silicon is transferred to a diffusion furnace where the silicon is reheated to diffuse the phosphorus from the glass into the silicon. The prediffusion of the silicon using a source glass consisting of fifteen parts by weight of phosphorus pentoxide to one part of calcium oxide may be performed by heating the glass and the silicon in a closed platinum box within a furnace at a temperature of 800° C. for a period of time of about ten minutes in a nitrogen atmosphere. Silicon and silicon dioxide react with the phosphorus pentoxide and calcium oxide vapors and a film of calcium phosphosilicate glass forms on the silicon. After prediffusion, the silicon wafers are transferred to another furnace of the combustion tube type where they are heated at a temperature of 1100° C. for one hour in water vapor and then are heated for two and one-half hours longer in the same furnace in an atmosphere of flowing dry oxygen. Water vapor for the furnace is supplied by vaporizing water by boiling and forcing the steam to flow through the diffusion furnace while vaporizing at a rate of approximately one-half pint of water for each four square inches of furnace tube cross section. After the one hour of water vapor exposure, dry oxygen is started through the furnace at about 1000 cc. per minute for the remainder of the diffusion period. The use of water vapor followed by oxygen causes the formation of the thick and dense glass required for masking against a subsequent P diffusion of boron from a film of borosilicate glass. This treatment or pi silicon of 3 ohm-centimeter resistivity will produce an NP junction about 3 microns deep and will form a layer of glass about 5000 angstrom units thick.

After selectively etching away the necessary regions of calcium phosphosilicate glass, a film of borosilicate glass is formed on the silicon wafer largely using well-known techniques. The regions of the silicon that were stripped of glass are given a light coat of silicon dioxide by heating in water vapor at 900° C. for thirty minutes. A combustion tube furnace is used and water is vaporized at a rate of about one-half pint per hour for a four square inch furnace tube cross section. After the silicon dioxide is formed, the wafers are heated and exposed to boron trioxide vapor in a closed system. Boron trioxide and the silicon wafers are separated in a small closed quartz or molybdenum box which is then heated to 950° C. in hydrogen for about one hour to form the borosilicate glass. The box, which is not completely gas tight, is heated in a combustion tube furnace in an atmosphere of hydrogen. The hydrogen flow through the combustion tube is about 1000 cc. per minute for a tube of about four square inches in cross section.

After these prediffusion operations, the silicon wafers are removed from the box and transferred to a combustion tube type diffusion furnace where boron impurity from the borosilicate glass film is diffused into the silicon. The silicon, typically, is diffused at a temperature of 1100° C. for thirty minutes in dry hydrogen. The hydrogen flow is typically 400 cc. per minute through a four square inch cross section tube. The conditions given this P-type prediffusion and diffusion are requirements for a transistor based on the formation of an emitter junction at the same time as the anti-channel region is formed. In the case where the less critical anti-channel region is diffused alone, a lighter or heavier diffusion is acceptable. For the two diffusions previously described, a PN emitter-to-base junction will be formed at a depth of about 2 microns.

Using the previously described processing, planar passivated PNP transistors having a breakdown voltage characteristic (measured with the collector-to-base junction reverse biased, the emitter open circuited, and with a collector current of 10 microamperes) of over 60 volts are routinely fabricated. Before this invention, a breakdown voltage of 20 volts was considered fairly high for this general type of transistor.

High breakdown voltage planar passivated devices generally may be expected to have greater intrinsic and commercial value than the lower breakdown voltage devices. This invention makes it possible, with little added expense, to manufacture planar passivated NP, PNP, and other NP junction devices having high breakdown voltage characteristics. For each device, this is accomplished by the simple and direct means of selectively diffusing P impurity into pi silicon in a region peripheral to the surface of the NP junction so that an N-type induced channel cannot exist in this region, thereby isolating, limiting the size, and minimizing the effect of that part of the induced N-type channel adjacent the true N region.

More fundamentally, this invention also provides a means of forming and isolating variously shaped N-type channels on pi silicon.

1. In a semiconductor device having a predetermined voltage breakdown characteristic, including a semiconductor element having a top surface on the body material thereof and having within said body material, a first region of one conductivity type, a second region of the opposite conductivity type within said first region, with each region extending to said surface and defining a rectifying junction between the regions, a third region of said one conductivity type within said second region, a thermally grown intimately bonded passivating coating on said surface and covering at least a portion of said three regions, and a channel underneath the coating in the body material immediately at said surface thereof extending laterally outwardly from said second region at said surface with said rectifying junction extending therewith at the interface between said channel and said first region, said channel being of the opposite conductivity type to said first region, the means for maintaining the voltage breakdown characteristic of the semiconductor device as originally determined in the design of said device comprising a channel-interrupting region extending from said top surface downwardly into said first region from said surface to a depth greater than the depth of said channel and completely surrounding and spaced from and separated laterally outwardly by a predetermined amount from said second region at said top surface and in the body material of the semiconductor element, said channel-interrupting region being of lower resistivity than the resistivity of said first region, of the same conductivity type as the first region and of lower resistivity and opposite conductivity relative to said channel, with said channel-interrupting region interrupting and terminating said channel at the inside face of said latter region and turning said rectifying junction upwardly at said inside face toward said top surface underneath said passivating coating.

2. In a semiconductor element for a semiconductor device which provides a high breakdown voltage characteristic and a low reverse current characteristic for the device by overcoming adverse effects of a channel region in the element represented in large reverse currents flowing through the channel region under the influence of reverse bias during operation of the device, said element having a collector region of one conductivity type, a base region within said collector region of the opposite conductivity type to that of the collector region and a rectifying junction between the same, and an emitter region within said base region of said one conductivity type, an insulating coating on the top surface of the element over at least a portion of each of said latter two regions, and said element having a channel region therein immediately at the top surface thereof underneath the insulating coating and extending laterally outwardly from said base region in said collector region, said channel region being of the same conductivity type as the base region, the improvement comprising a channel-interrupting region in said collector region of the same conductivity type as that of the collector region but of lower resistivity than the resistivity of said collector region and extending downwardly in said collector region from the top surface of the element to a depth greater than the depth of said channel region from the element surface, said channel-interrupting region being separated from and spaced laterally outwardly in the semiconductor element by a predetermined amount from said base region, completely surrounding said base region, of the opposite conductivity type to that of said base region and of said channel region, and of lower resistivity than that of the channel region, with said channel-interrupting region interrupting and terminating such channel region and the flow of said large reverse currents therethrough and turning upwardly toward the element surface underneath the coating the base-collector rectifying junction which extends along the interface of the channel region within the collector region.

3. In a semiconductor device including a semiconductor element having a top surface on the body material thereof and having within the body material a first region of one conductivity type, a second region of the opposite conductivity type with each region extending to said top surface, a rectifying junction between said two regions, and an insulating coating on said top surface over at least a portion of each of said two regions, the means for maintaining a predetermined voltage breakdown characteristic for the semiconductor device comprising a channel-interrupting region extending into said first region from said top surface and completely surrounding but separated from and spaced laterally outwardly by a predetermined amount from said second region both at said surface and in the body material of the semiconductor element, said channel-interrupting region being of lower resistivity than the resistivity of said first region but of the same conductivity type as the first region, with said channel-interrupting region interrupting and terminating at the face thereof toward the second region, any channel formed in the first region immediately at the surface of the semiconductor element below the insulating coating and extending laterally outwardly from the second region to said channel-interrupting region, with said channel-interrupting region being deeper in said first region than the depth of any such channel, being of an opposite conductivity type to that of such a channel, and having a resistivity lower than the resistivity of any such a channel.

4. In a semiconductor device comprising a semiconductor body having a first region of one conductivity type extending into said body from one surface thereof, a second region of opposite conductivity type to that of said first region extending into said first region from said surface to define an original rectifying junction between the second region and the first region, with said junction extending toward said surface about the second region, the means for providing a high voltage breakdown characteristic for the device comprising a third region of the same conductivity type as the first region, the third region extending into the first region from said surface to define an area at said surface and in said semiconductor body completely surrounding the boundary of said second region but laterally displaced outwardly and separated in the semiconductor device from said second region an amount sufficient to accommodate the entire depletion region required in the semiconductor body to provide the high voltage breakdown characteristic for the device, said third region extending into the semiconductor body from said one surface a depth so as to interrupt any channel formed in the semiconductor body immediately below said surface and extending from the second region to the third region through which large reverse currents might flow in the absence of such third region.

5. In a semiconductor structure for which a high voltage breakdown characteristic was originally determined in designing the same, a semiconductor portion for said structure having a body with two adjacent regions therein of opposite conductivity type including a first region and a second region with a rectifying junction at the interface thereof, having a passivating insulating coating on the top surface thereof under which a channel region can form within the semiconductor portion body immediately at said top surface and through which large reverse currents could flow during the operation of the structure to adversely affect such original breakdown characteristic, with such a channel region extending out of said second region into said first region and being of opposite conductivity type to said first region, and with said rectifying junction extending outwardly from said second region with such a channel region at the interface thereof with said first region, (a) the improvement comprising means for terminating such a channel region and stopping such large reverse current flow therethrough and for providing for such semiconductor structure the originally determined high voltage breakdown characteristic, (b) said means comprising a channel-interrupting region in the body of the semiconductor portion at said first region which completely surrounds said second region and is spaced away and separated laterally from said second region by a width at least equal to the width of the depletion region in the unchannelled portions of the first region at voltage breakdown in order to effect the originally determined voltage breakdown characteristic, said channel-interrupting region being of opposite conductivity type to any such a channel region and extending downwardly from said top surface a depth such as to turn said extension of said rectifying junction upwardly toward said top surface.

6. In a semiconductor structure as defined in claim 5, wherein a metal contact is ohmically connected to said second region at said top surface for an electrical connection thereto, and said channel-interrupting region is covered by an insulating coating and has no metal contact connected thereto at said top surface of said semiconductor portion of said structure.

7. In a semiconductor structure as defined in claim 5, a metal contact ohmically connected to said first region for making an electrical connection to said first region, a metal contact ohmically connected to said second region for electrical connection thereto, and with said channel-interrupting region being covered at said top surface with a passivating insulating coating and having no metal contact thereto for electrical connection therefrom.

8. In semiconductor structure having a predetermined voltage breakdown characteristic, including a semiconductor portion having a top surface thereon, and having (a) a first region of one conductivity type and a second region of the opposite conductivity type in the body of said semiconductor portion, with each said region extending to said surface, and said two regions forming a rectifying junction therebetween, (b) a coating of silicon dioxide on said top surface extending over at least portions of said two regions, (c) a channel region in the first region underneath said silicon dioxide coating, contiguous on one of its sides with said top surface of the semiconductor portion and contiguous on its other side with said first region, and extending laterally in said first region outwardly from said second region, with said second region-first region rectifying junction extending along the interface between said first region and said channel region, (d) the means for maintaining the voltage breakdown characteristic of the semiconductor structure as originally determined and for terminating large reverse currents which would flow through said channel region in the absence of said means, said means comprising (e) a third region underneath said silicon dioxide coating extending from said top surface of the semiconductor portion into said first region to a depth greater than the depth of said channel region, said third region completely surrounding said second region at said top surface and in the body material of the semiconductor portion, and spaced away from and separated laterally from said second region by a width at least equal to the width of the depletion region in the un-channelled portions of said first region at voltage breakdown in order to maintain the original high voltage breakdown characteristic for said structure, said third region being of lower resistivity than the resistivity of said first region and of the same conductivity type as the first region and turning upwardly toward said top surface said rectifying junction which extends along the interface of said channel region and said first region and thereby terminating said channel region.

9. In a semiconductor device including (a) a semiconductor portion having a top surface, and having (b) a first region of one conductivity type and a second region of the opposite conductivity type in the body material of said semiconductor portion, and said two regions defining a first region-second region rectifying junction therebetween, said semiconductor portion having a thermally grown silicon dioxide coating on said top surface and over portions at least of said first and said second regions which is capable of inducing a relatively thin channel region into the body material immediately below the coating contiguous on one of its sides with said top surface of the semiconductor portion and contiguous on its other side with said first region and extending laterally outwardly in said first region from the second region, (c) the means for providing the voltage breakdown characteristic of the semiconductor device as originally intended in the design of the device comprising (d) a third region underneath said silicon dioxide coating extending from said top surface of said semiconductor portion into said first region to a depth greater than the depth of any such a relatively thin channel region which is formed therein, said third region completely surrounding said second region at said top surface and in the body material of said semiconductor portion and being spaced away from and separated laterally outwardly from said second region by a width at least equal to the width of the depletion region in the unchanneled portions of said first region at voltage breakdown in order to attain the originally designed high voltage breakdown characteristic for the device, said third region being of lower resistivity than the resistivity of said first region and of the same conductivity type as the first region, with such a channel region between said second region and third region being of a resistivity higher than that of said third region and of a conductivity type opposite to the conductivity type of the third region and forming a rectifying junction with the first and said third regions, with said third region at its face toward the second region turning said latter rectifying junction upwardly toward said top surface underneath said thermally grown silicon dioxide coating and interrupting and terminating such a channel region.

10. In semiconductor structure having a semiconductor portion including therein, (a) a first region of one conductivity type, (b) a second region wholly within said first region, of the opposite conductivity type, and forming a second region-first region rectifying junction, (c) a third region of said one conductivity type being wholly within the second region and forming a rectifying junction therewith, (d) a thermally grown passivating coating on the top surface of the semiconductor portion overlying said rectifying junctions, (e) a channel region in said first region immediately underlying said passivating coating which extends laterally outwardly from the second region, is of the same conductivity type as the second region, is of the opposite conductivity type to the first region, and has a continuation of the second region-first region rectifying junction at its interface with said first region, (f) ohmic metal contacts at said top surface of said semiconductor portion with one contact for the second region and one contact for the third region in electrical and mechanical connection therewith, (g) and a borosilicate layer at said thermally grown passivating coating surrounding said ohmic metal contacts, (h) the improvement which comprises a channel-interrupting region in said first region of the same conductivity type of the first region and of opposite conductivity type to said channel region, and which completely surrounds said second region, and is separated from said second region by a width at least equal to the width of the depletion region in the unchanneled portions of said first region at voltage breakdown, with said channel-interrupting region extending from said top surface of said semiconductor portion downwardly therein a vertical dimension such as to interrupt and terminate said channel region at the interface of said channel region with said channel-interrupting region and turn said continuation of said second region-first region rectifying junction upwardly toward said top surface so as to prevent the flow of large reverse currents through said channel region and thereby provide a desired reverse current characteristic and a high voltage breakdown characteristic for the structure.

11. In a semiconductor element for incorporation in a semiconductor structure that provides a high breakdown voltage characteristic and a low reverse current characteristic for the semiconductor structure by overcoming adverse effects of a channel region in the element through which large reverse currents will flow under the influence of reverse bias when the semiconductor structure is incorporated into an operating circuit, (a) with said element having a first region of one conductivity type, (b) a second region encompassed within said first region of the opposite conductivity type to the first region, with each region extending into said element from the top surface thereof, and forming a rectifying junction at the interface between said first and second regions, (c) an insulating coating on the top surface of the element over at least a portion of each of said first and second regions, and with said element capable of having formed in said first region immediately beneath said coating a channel-region extending out of said second region into said first region of opposite conductivty type to that of said first region which would thereby extend said rectifying junction from said second region-first region interface along the interface between such a channel region and said first region, (d) the improvement in said semiconductor element comprising a channel-interrupting region in said first region of the same conductivity as that of the first region but of lower resistivity than the resistivity of said first region, said channel-interrupting region having a resistivity lower than any such a channel region and a conductivity type opposite to that of any such a channel region, said channel-interrupting region completely surrounding the second region and separated and spaced laterally outwardly a predetermined amount from said second region in the semiconductor element and at the surface extending downwardly into said first region to a depth from said top surface greater than the width of any such channel region from said top surface, and said channel-interrupting region acting to terminate any such a channel region and the flow of large reverse currents therethrough so that when said element is incorporated in a semiconductor structure, it provides a high breakdown voltage characteristic and a low reverse current characteristic during the operation of such a semiconductor structure.

12. In a semiconductor element as defined in claim 11 wherein the channel-interrupting region is spaced laterally away from said second region by a width at least equal to the width of the depletion region in the unchanneled portions of said first region at voltage breakdown for the semiconductor structure in which the element is incorporated.

13. A transistor having a high voltage breakdown characteristic which comprises in combination, (a) a semiconductor crystal element having an insulating layer on the top surface thereof, (b) said crystal element including a collector region of one conductivity type, a base region therein of the opposite conductivity type and contiguous therewith, and an emitter region within said base region of the same conductivity type as the collector region and contiguous with said base region, with a rectifying junction between each said two contiguous regions and each rectifying junction extending upwardly in said crystal element under said insulating layer, (c) a channel in the collector region of the opposite conductivity type to that of the collector region extending out of said base region under said insulating layer and immediately below said surface which extends the collector-base rectifying junction laterally therewith along an interface between said channel and said collector region, (d) and a further region surrounding but separated laterally a predetermined amount from said base region and of opposite conductivity type than that of the base region, said further region being in said collector region, having a lower resistivity than said collector region, extending from within said collector region upwardly to said insulating layer and interrupting said channel so that the extension of said collector-base rectifying junction formed by said channel with the collector region is terminated by said further region and is turned upwardly toward said insulating layer to extend to and intersect said top surface.

14. A semiconductor diode with a high voltage breakdown characteristics having in combination, (a) a semiconductor element with a top surface thereon and a passivating coating on at least a portion of said top surface, (b) a first region and a second region in the semiconductor element, (c) ohmic metal contacts respectively to said two regions, (d) said second region being wholly within said first region, being of a conductivity type opposite to that of said first region, and forming a second region-first region rectifying junction therewith, (e) and a channel-interrupting region in said element, completely surrounding and separated laterally a predetermined amount from said second region, said channel-interrupting region being of the opposite conductivity type to that of said second region and extending into said element from said top surface thereof to a depth such that it extends over the entire vertical dimension of any channel region which is formed immediately below the top surface passivating coating in such first region and extends out of said second region into said first region laterally outwardly to said channel-interrupting region to form a rectifying junction therewith which is an extension of said second region-first region rectifying junction, with the conductivity type of said channel-interrupting region being opposite to that of any such channel region, whereby said rectifying junction turns upwardly at said channel-interrupting region to intersect with said top surface at said passivating coating, and with said channel-interrupting region having no ohmic metal contact connected thereto at said top surface.

15. In semiconductor structure which has desired reverse current and breakdown voltage characteristics, a semiconductor element having therein a first region, a second region encompassed within said first region of opposite conductivity type to the first region, a junction at the interface of said two regions, and a grown passivating coating over at least a portion of the top surface of the semiconductor element, the combination comprising a channel region formed within said element immediately at said top surface below said coating, extending laterally out of said second region into said first region and disposed over an area completely surrounding said second region, said channel region being of opposite conductivity type to said first region and of higher resistivity than the same, with said junction likewise extending outwardly from said second region along the interface of said channel region and said first region, and means in said first region which structurally blocks and interrupts said channel region and provides the desired reverse current characteristic and maintains the desired breakdown voltage characteristic for the semiconductor device, said means comprising a channel-interrupting region formed in said first region at a place spaced laterally away and separated from said second region and completely surrounding said second region, which extends downwardly in said first region from said top surface a depth greater than the depth from said top surface of said channel region and turns said juction upwardly toward and to said top surface underneath said passivating coating to prevent large reverse currents from flowing in said channel region, said channel-interrupting region being of the same conductivity type as the first region and of lower resistivity than the same, with said channel region being of a dimension over its entirety between said second region and said channel-interrupting region such that the depletion region in the semiconductor element during the operation of the semiconductor structure will accommodate the entire depletion-region spreading for maintaining said desired breakdown voltage characteristic for such structure.

References Cited by the Examiner

UNITED STATES PATENTS

| | | | |
|---|---|---|---|
| 2,748,325 | 5/1956 | Jenny | 317—234 |
| 2,816,850 | 12/1957 | Haring | 317—235 X |
| 2,899,344 | 8/1959 | Atalla et al. | 317—235 X |
| 2,936,410 | 5/1960 | Emeis et al. | 317—235 |
| 2,997,604 | 8/1961 | Shockley | 307—88.5 |
| 3,007,090 | 10/1961 | Rutz | 317—235 |
| 3,025,589 | 3/1962 | Hoerni | 317—235 X |

(Other references on following page)

UNITED STATES PATENTS

| | | | |
|---|---|---|---|
| 3,074,826 | 1/1963 | Tummers | 317—235 X |
| 3,091,701 | 5/1963 | Statz | 317—235 X |
| 3,099,591 | 7/1963 | Shockley | 148—33 |
| 3,140,438 | 7/1964 | Shockley et al. | 323—22 |
| 3,197,681 | 7/1965 | Broussard | 317—235 |

FOREIGN PATENTS

| | | |
|---|---|---|
| 1,279,484 | 11/1961 | France. |
| 924,121 | 4/1963 | Great Britain. |

OTHER REFERENCES

"Some Effects of Semiconductor Surfaces on Device Operation," by George de Mars; April 1959 issue of Semiconductor Products.

Article by O. Jantsch; found in the magazine, "Solid State Electronics," pages 249–259; July/August 1962. Published by Pergamon Press, Oxford, England.

JOHN W. HUCKERT, *Primary Examiner.*

JAMES D. KALLAM, *Examiner.*

E. PUGH, A. M. LESNIAK, *Assistant Examiners.*